(12) United States Patent
Boesel et al.

(10) Patent No.: US 7,474,099 B2
(45) Date of Patent: Jan. 6, 2009

(54) NMR APPARATUS WITH COMMONLY COOLED PROBE HEAD AND CRYOGENIC CONTAINER AND METHOD FOR THE OPERATION THEREOF

(75) Inventors: Johannes Boesel, Neuheim (CH); Agnès Glémot, Zurich (CH); Daniel Eckert, Bachenbuelach (CH); Daniel Guy Baumann, Russikon (CH)

(73) Assignee: Bruker Biospin AG, Faellanden (CH)

( * ) Notice: Subject to any disclaimer, the term of this patent is extended or adjusted under 35 U.S.C. 154(b) by 319 days.

(21) Appl. No.: 11/509,778

(22) Filed: Aug. 25, 2006

(65) Prior Publication Data
US 2007/0107445 A1 May 17, 2007

(30) Foreign Application Priority Data
Sep. 1, 2005 (DE) .................. 10 2005 041 383

(51) Int. Cl.
*G01V 3/00* (2006.01)
(52) U.S. Cl. .................. 324/318; 324/309; 324/315; 324/321
(58) Field of Classification Search ......... 324/300–322; 62/600–616, 45.1–48.4, 51.1
See application file for complete search history.

(56) References Cited
U.S. PATENT DOCUMENTS

| | | | | |
|---|---|---|---|---|
| 4,935,714 A | * | 6/1990 | Vermilyea | 505/211 |
| 5,187,938 A | * | 2/1993 | Mraz et al. | 62/51.1 |
| 5,379,600 A | * | 1/1995 | Moritsu et al. | 62/47.1 |
| 5,381,666 A | * | 1/1995 | Saho et al. | 62/47.1 |
| 5,412,363 A | * | 5/1995 | Breneman et al. | 335/216 |
| 5,586,437 A | * | 12/1996 | Blecher et al. | 62/47.1 |
| 5,737,927 A | | 4/1998 | Takahashi | |
| 5,814,992 A | * | 9/1998 | Busse-Grawitz et al. | 324/318 |
| 5,889,456 A | * | 3/1999 | Triebe et al. | 335/300 |
| 5,966,944 A | * | 10/1999 | Inoue et al. | 62/51.1 |
| 6,181,228 B1 | | 1/2001 | Laskaris | |
| 6,204,665 B1 | * | 3/2001 | Triebe et al. | 324/318 |

(Continued)

FOREIGN PATENT DOCUMENTS

EP 1 560 035 8/2005

(Continued)

*Primary Examiner*—Dixomara Vargas
(74) *Attorney, Agent, or Firm*—Paul Vincent

(57) ABSTRACT

An NMR apparatus comprising an NMR magnet system disposed in a first cryocontainer (2) of a cryostat (9), and an NMR probe head (1), wherein the first cryocontainer (2) is installed in an evacuated outer jacket and is surrounded by a radiation shield (24) and/or a further cryocontainer (3), wherein a cooling device is provided for cooling the NMR probe head (1) and a cryocontainer (2, 3), which comprises a cold head (4, 4a, 4b, 4c) with several cold stages (12a, 12b, 12c, 18a, 18b, 18c, 19a), wherein one cold stage (12a, 12b, 12c, 18a, 18b, 18c, 19a) is connected to a heat-transferring device, and wherein a cooling circuit is provided between the cooling device and the NMR probe head (1), is characterized in that the cooling device is disposed in a separate, evacuated housing (6) which is positioned directly above the cryostat (9), wherein the heat-transferring device is inserted directly into suspension tubes (29a, 29c) of the cryocontainer (2, 3) and/or is in contact with the radiation shield (24). This effects a simple construction that is efficient for cooling an NMR apparatus.

31 Claims, 8 Drawing Sheets

U.S. PATENT DOCUMENTS

| | | |
|---|---|---|
| 6,246,308 B1 | 6/2001 | Laskaris |
| 6,437,570 B2 * | 8/2002 | Marek .................. 324/321 |
| 6,441,617 B2 * | 8/2002 | Marek .................. 324/318 |
| 6,466,019 B2 * | 10/2002 | Marek .................. 324/318 |
| 6,677,751 B1 * | 1/2004 | Marek et al. ............ 324/318 |
| 6,686,740 B2 * | 2/2004 | Tschirky et al. .......... 324/321 |
| 6,727,699 B2 * | 4/2004 | Kasten .................. 324/318 |
| 6,807,812 B2 * | 10/2004 | Lehmann et al. ......... 62/47.1 |
| 7,030,613 B2 * | 4/2006 | Morita et al. ............ 324/318 |
| 7,126,335 B2 * | 10/2006 | Morita et al. ............ 324/318 |
| 7,141,979 B2 * | 11/2006 | Marek .................. 324/322 |
| 7,157,999 B2 * | 1/2007 | Kasten .................. 335/216 |
| 7,183,769 B2 * | 2/2007 | Kasten et al. ............ 324/318 |
| 7,408,353 B2 * | 8/2008 | Marek et al. ............ 324/318 |
| 2006/0130493 A1 * | 6/2006 | Strobel .................. 62/51.1 |

FOREIGN PATENT DOCUMENTS

| | | |
|---|---|---|
| JP | 10 321 430 | 12/1998 |
| JP | 11 087 130 | 3/1999 |
| JP | 2002 124410 | 4/2002 |
| JP | 2003009286 | 5/2004 |
| WO | WO 03/023433 | 3/2003 |

* cited by examiner

NMR APPARATUS WITH COMMONLY COOLED PROBE HEAD AND CRYOGENIC CONTAINER AND METHOD FOR THE OPERATION THEREOF

This application claims Paris Convention priority of DE 10 2005 041 383.8 filed Sep. 01, 2005 the complete disclosure of which is hereby incorporated by reference.

BACKGROUND OF THE INVENTION

The invention concerns an NMR apparatus comprising an NMR magnet system disposed in a first cryocontainer of a cryostat, and an NMR probe head disposed in a room temperature bore of the cryostat and comprising an RF resonator for receiving NMR signals from a sample under investigation, and with a preamplifier, wherein the first cryocontainer is installed in an evacuated outer jacket and is surrounded by at least one radiation shield and/or a further cryocontainer, wherein a cooling device is provided for cooling the NMR probe head and at least one cryocontainer, the cooling device comprising a compressor-operated cryocooler cold head having several cold stages at different temperature levels, wherein at least one cold stage of the cold head is thermally conductingly connected to a heat-transferring device, and wherein at least one cooling circuit with a refrigerant is disposed between the cooling device and the NMR probe head and is driven by the cryocooler compressor or by a pump via a transfer line which is at least partially thermally insulated.

A device of this type is disclosed in WO 03/023433 and EP 1 560 035. NMR apparatus are used for imaging or spectroscopy. They usually contain superconducting magnets, which must be cooled down to very low temperatures.

Most modern NMR magnet systems are still cooled with liquid cryogens ($LN_2$, LHe). Handling of these cryogens is, however, difficult. They must be refilled at regular time intervals that often require undesired interruption of the measurements. The dependence on liquid cryogens is also problematic if the infrastructure is inadequate such as e.g. in developing countries (India, China, etc.). Future cryogen price increases could render such cooling very expensive.

For this reason, attempts have been made to cool magnet systems directly or indirectly using mechanical cooling apparatus, so-called cryocoolers. One concept has proven to be particularly successful with which one or two liquid cryogens are provided inside the cryostat that are reliquefied after evaporation (due to external heat input) using the cryocooler. This produces magnet systems with no external cryogen loss. There are several variants such as e.g. installation of the cold head of the cryocooler directly into the cryostat, in the vacuum-insulated region of the outer jacket of the cryostat or in a helium atmosphere of a neck tube, which directly connects the helium container to the outer jacket.

Cooling of the RF resonator and preamplifier of an NMR probe head has been practiced for some time. This improves the signal-to-noise ratio, i.e. the resolution of the NMR signal and accelerates the measurements. The NMR probe head is cooled via a gas refrigeration circuit that is connected to a cryocooler. The cold head of the cryocooler and the various components of the gas refrigeration circuit, such as heat exchangers and valves, are in a separate thermally insulated housing which is disposed next to the magnet cryostat. The cryocooler is driven by a compressor, which usually has an input power of approximately 7 kW. Cooling of the RF resonator and preamplifier of an NMR probe head is described in U.S. Pat. No. 5,889,456.

Combination of a cryogen loss-free magnet system with an NMR probe head requires two cooling systems occupying a great deal of space, incurring high acquisition and operating costs and having further disadvantages.

WO 03/023433 (Oxford Instruments Superconductivity) therefore discloses combined cooling of a magnet system and a probe head using only one cooler. One single cryocooler (Gifford-McMahon or pulse tube cooler) is thereby used for cooling the (magnet) cryostat and for cooling a more or less rigidly mounted probe head. The cold head of the cooler is thereby integrated in the cryostat. The first cold stage of the cold head is in contact with a radiation shield of the cryostat, while the second cold stage directly liquefies evaporating helium. A separate helium gas circuit driven via a pump is guided over the cold stages where the gas cools and is liquefied to be subsequently guided to the probe head (with gradient coils and an RF resonator in a separate housing that can be evacuated) and the shim coils (in the cryostat or in the housing of the RF unit that can be evacuated) via a line, preferably inside the cryostat, or in a separate housing that can be evacuated.

This arrangement is, however, relatively complicated and precludes flexible operation, since the components (gas lines, probe head) are partially fixed. The thermodynamic efficiency of the conventional arrangement is very low due to the long transfer lines, the heat input via the circulating pump and the contacts between the cooling circuit and the radiation shield at very low temperatures. It is also doubtful whether the refrigeration capacity achieved with current cryocoolers is sufficient to cool the cryostat and the probe head in the manner proposed. One further problem is the fact-that the cooler and the magnet are only insufficiently decoupled concerning vibrations, such that the magnetic field of the magnet system may be influenced by the cryocooler. Moreover, NMR measurements cannot be performed during maintenance of the cooling system of this apparatus.

Some disadvantages of WO 03/023433 are eliminated in EP 1 560 035 (Oxford Instruments Superconductivity). The cooling device proposed therein has a better thermodynamic efficiency. However, there are still serious disadvantages. The cold head of the cryocooler is rigidly installed in the cryostat, such that vibrations and electromagnetic disturbances of the cold head are more or less directly transferred to the magnet cryostat. Conversely, the superconducting magnet in the magnet cryostat can influence the cryocooler. Maintenance or exchange of the cold head still involves considerable effort and costs, since operation of the entire magnet system must be stopped. Moreover, retrofitting of existing conventional magnet systems is difficult, which requires a completely new construction.

It is therefore the underlying purpose of the present invention to propose an NMR apparatus that eliminates the above-mentioned disadvantages and has a simple construction.

SUMMARY OF THE INVENTION

This object is achieved in accordance with the invention in that the cooling device is disposed in a separate, evacuated and thermally insulated housing, which is positioned directly above the cryostat of the NMR magnet system, wherein at least one of the heat-transferring devices is inserted directly and proximately in suspension tubes of the first and/or further cryocontainer of the cryostat, which connect the cryocontainer to the outer jacket, and/or is in contact with the radiation shield.

Since the housing with cooling device is disposed outside of the cryostat and is thereby spatially separated from the cryostat, the mechanical or magnetic disturbances in the working volume caused by the cooling device are reduced compared to the conventional devices of WO 03/023433 and EP 1 560 035.

Moreover, the external arrangement of the housing permits retrofitting to conventional existing systems. Since the cold head is not disposed in the cryostat, the cooler can be serviced without interrupting operation of the cryostat.

Direct cooling of the helium container without transfer lines or external gas circuits reduces the problems caused by impurities, which can e.g. block the lines. This also reduces the refrigeration loss through transfer lines and effects highly efficient cooling of the magnet system.

The magnet system and the NMR probe head of the inventive NMR apparatus can be cooled in two physically separate, independent mechanisms for coupling to the cooling source, such that cooling of a subsystem to be cooled (magnet system or NMR probe head) can be interrupted without influencing cooling of the other subsystem.

The inventive NMR apparatus is moreover compact since the cooling device requires no space next to the cryostat.

The cooling device of the inventive NMR apparatus can also be advantageously used for other structure-resolving methods, such as e.g. ion cyclotron resonance spectroscopy (ICR) or electron spin resonance (ESR, EPR).

In one special embodiment of the inventive NMR apparatus, the housing of the cooling device is mounted to the cryostat of the NMR magnet system.

In an alternative embodiment, the housing of the cooling device is mounted externally, in particular, to the ceiling of a room or a stand.

In both embodiments, the cooling device is advantageously connected in a gas-tight manner to the cryostat of the NMR magnet system and the probe head via components which do not transmit or which substantially dampen vibrations, in particular, via bellows. Coupling to the cryostat and the NMR probe head via "soft" components prevents transmission of vibrations from the cooling device to the cryostat and the NMR probe head.

In an advantageous embodiment of the inventive NMR apparatus, at least one of the heat-transferring devices comprises a metallic connection having a high thermal conductivity, whose end projecting into the suspension tube of the cryocontainer liquefies a cryogen, which evaporates from one of the cryocontainers of the cryostat. In this case, the cryogen is liquefied directly in the cryocontainer.

With particular advantage, the cryocooler is a pulse tube cooler or a Gifford-McMahon cooler with at least two cold stages. Due to efficient decoupling from vibrations, it is also possible to use cryocoolers with greater vibration per se, such as e.g. Gifford-McMahon coolers, compared to low vibration pulse tube coolers that are often preferred in other cryostat cooling applications. However, other coolers such as e.g. Stirling or Joule-Thomson coolers may also be used.

For guiding the cryogen evaporated from one of the cryocontainers of the cryostat to the cold stage and for returning the cryogen liquefied at the cold stage into the cryocontainer of the cryostat, at least one of the heat-transferring devices advantageously has a line, in particular a pipe conduit, which is open at both ends, and a cavity, wherein one open end of the line terminates in the cavity and the other open end of the line terminates in the cryocontainer. The cryogen evaporated from the cryocontainer thereby flows through the line and into the cavity, which is connected to a cold stage of the cold head of the cryocooler, and is liquefied. The line may include one or more concentric pipes such that the cryogenic vapor passes in an outer annular gap to the cavity and the cryogen liquefied in the cavity returns to the cryocontainer through the inner tube. In order to ensure optimum insulation from the surroundings, the line may additionally be provided with a vacuum insulation along part or all of its length.

In a particularly preferred embodiment of the invention, for guiding the cryogen, evaporated from the further cryocontainer of the cryostat and heated in the suspension tube approximately to the surrounding temperature, to the cold stage which is not the coldest cold stage, and for returning the liquefied cryogen, which is cooled at the cold stage to liquefying temperature, to the further cryocontainer, at least one of the heat-transferring devices has a further line which is open at both ends, in particular a pipe conduit, which is in good thermal contact with the cold stage and is connected at one open end to the warm end of the suspension tube and whose other open end extends into the further cryocontainer. The evaporating cryogen is heated in the suspension tube, which reduces the heat input into the cryogen supply containers. It escapes in the form of overheated vapor (gas) and is discharged via the further line. The cryogen is cooled again and liquefied through contact between the further line and the cold head, and is subsequently returned to the cryostat.

The heat-transferring device advantageously comprises a further line which is open at both ends, in particular a pipe conduit, which is in good thermal contact with the cold stage (s) of the cold head of the pulse tube cooler and at least the coldest regenerator tube of the cold stages of the cold head of the pulse tube cooler, for guiding the cryogen evaporated from the first cryostat cryocontainer and heated in the suspension tube to approximately the surrounding temperature, to the cold stage (s) of the cold head of the pulse tube cooler, which is warmer than the coldest cold stage, and for returning the cryogen into the first cryocontainer, wherein one open end of the further line is connected to the warm end of the suspension tube, and the other open end of the further line extends into the first cryocontainer, such that the cryogen is cooled to liquefying temperature and liquefied. This configuration also permits thermodynamically efficient cooling and liquefaction of gas having a low boiling temperature, such as e.g. helium. The additional heat input into the regenerator of the coldest cold stage has no substantial effect on the refrigeration capacity of the cryocooler as long as the amount of gas to be cooled and liquefied is not excessive. Moreover, the overall efficiency of the apparatus is increased, since the suspension tube of the first cryocontainer is cooled by the cryogen flow discharged at the warm end of the suspension tube, such that the heat input via the suspension tube is ideally eliminated.

In a particularly preferred embodiment of the inventive NMR apparatus, at least one of the heat-transferring devices is designed as an additional closed cooling circuit with an additional refrigerant between at least one cold stage of the cold head and at least one of the cryocontainers and/or the radiation shield, wherein the additional refrigerant is a gas with low boiling temperature, wherein the additional cooling circuit is driven through free convection, a circulating pump, or the compressor of the cryocooler. When the additional cooling circuit is driven through free convection, the additional pump or circulation of the process gas by the refrigeration compressor can be omitted.

One of the heat-transferring devices which is inserted into the first cryocontainer is alternatively designed as partial circuit of the cooling circuit of the NMR probe head, wherein a gas having a low boiling temperature is provided as refrigerant and a device for intermediate expansion of part of the refrigerant is provided for precooling another part of the refrigerant, wherein the cooling circuit is driven via the compressor of the cryocooler and/or a further compressor. Expansion of part of the flow of the refrigerant in a throttle device using a real gas can effect cooling in dependence on the initial and final states (positive Joule-Thomson effect). The refrigeration capacity for cooling the first cryocontainer can thereby be provided even at a temperature below the temperature of the coldest cold stage of the cold head through suitable process control. An additional compressor may, however, be required when the refrigerant is expanded to a pressure lower than the low pressure provided by the refrigeration compressor.

Moreover, at least one of the heat-transferring devices which is inserted into the further cryocontainer or which is in contact with the radiation shield, may be designed as a partial circuit of the cooling circuit of the NMR probe head, wherein the circuit is driven by the compressor of the cryocooler or by a circulating pump. Towards this end, part of the refrigerant used for cooling the NMR probe head and having a suitable temperature is branched off from the main flow and guided in a separate transfer line to the further cryocontainer or the radiation shield. The gas accepts the heat input into the further cryocontainer or the radiation shield via a heat-transferring device. When a further cryocontainer is used, the cryogen loss is reduced or even eliminated, such that refilling of cryogen is not or is only sporadically required.

At least one of the heat-transferring devices of the inventive NMR apparatus is advantageously insulated from external heat input, in particular, using vacuum insulation, thereby increasing the efficiency of the NMR apparatus.

The heat-transferring device is flexible at least in sections and is, in particular, designed as a bellows and/or in the form of braided wires to stop or dampen transmission of vibrations from the cooling device to the magnet cryostat or the NMR probe head.

The coldest cold stage of the cold head of the cryocooler can advantageously generate liquid helium at a temperature of 4.2 K or less. This is required, in particular, when a magnet system with low temperature superconductors is used.

One cold stage of the cryocooler cold head should preferably generate liquid nitrogen at a temperature of 77 K or less to permit use of a further cryocontainer with liquid nitrogen in the cryostat of the NMR magnet system or to cool a radiation shield to a thermodynamically suitable temperature.

With particular advantage, at least part of the refrigerant is in thermal contact with at least the coldest regenerator tube of the cold stages of the pulse tube cooler in the cooling circuit for cooling the NMR probe head, such that the refrigerant is cooled to a temperature in a range between the temperatures of the two coldest cold stages. The NMR probe head can thereby be cooled with temperatures of between approximately 4.2 and 50 K. The additional heat input into the regenerator tubes of the cold stages influences the refrigeration capacity of the pulse tube cooler, thereby, however, increasing the overall thermodynamic efficiency of the apparatus.

In a particularly preferred embodiment of the invention, a connecting line is provided between at least one of the suspension tubes of the first cryocontainer, into which no heat-transferring device is inserted, and the first cryocontainer, wherein the connecting line is in contact with at least one cold stage of the cold head of the cryocooler of the cooling device, wherein a valve and/or a pump can be inserted into the connecting line. When a pulse tube cooler is used, the connecting line may also be connected to the regenerator tube of the coldest cold stage. This at least reduces the heat input via the suspension tube without an inserted heat-transferring device due to the presence of a cooling flow through the suspension tube. The overall efficiency of the apparatus is increased.

One particular embodiment of the inventive NMR apparatus provides a separate closed cooling circuit with liquid nitrogen and/or nitrogen vapor within which the liquid nitrogen of the cooling circuit evaporates and is reliquefied by the cold head of the cooling device, for cooling the preamplifier of the NMR probe head, wherein the cooling circuit is driven through free convection or by a circulating pump, wherein insulation from external heat input, in particular vacuum insulation, is provided. This variant may be thermodynamically advantageous to increase the overall efficiency of the apparatus.

An electric heating means is advantageously provided in at least one of the cryocontainers in order to prevent excessive liquefaction of cryogen and a decrease of pressure in the cryocontainer e.g. due to excessive cooling capacity of the cryocooler.

Alternatively, an electric heating means may be provided on the cold stages of the cold head of the cryocooler of the cooling device or on other components of the cooling device, in particular, on the heat-transmitting devices or the lines.

With particular preference, helium is used as refrigerant of the cooling circuit between the cold head of the cryocooler and the NMR probe head and/or as further refrigerant of the further cooling circuit between the cold head of the cryocooler and at least one of the cryocontainers. At normal pressure, helium is liquefied only at 4.2 K and is therefore also suited as refrigerant for very low temperature applications. Phase changes no longer occur at a pressure above the critical pressure (2.29 bars), such that helium can be used as (quasi one-phase) refrigerant even below 4.2 K.

The invention also concerns a method for operating an NMR apparatus according to any one of the preceding claims, wherein the NMR probe head and at least one cryocontainer of the NMR apparatus are cooled using a common cryocooler. The inventive method is characterized in that the temperature and refrigeration capacity required for cooling the NMR probe head and the cryocontainer are generated outside of the cryostat, wherein at least one heat-transferring device which is in contact with the cold head of the cryocooler is directly and proximately inserted into suspension tubes of the first and/or further cryocontainer of the cryostat and/or in contact with the radiation shield, wherein the gaseous cryogen in the cryocontainer is liquefied using the heat-transferring device, and wherein a refrigerant is guided from the cooling device to the NMR probe head via at least one at least partially thermally insulated transfer line disposed outside of the cryostat.

In one variant of the inventive method, the gaseous cryogen in the cryocontainer is liquefied at the end of a metallic connection which projects into at least one of the cryocontainers and which has a high thermal conductivity.

Moreover, the cryogen evaporating from one of the cryocontainers of the cryostat can be guided through a line, in particular a pipe conduit, to a cavity at the cold stage of the cold head of the cryocooler, be liquefied at the cold stage and subsequently returned through the pipe conduit to the cryocontainer of the cryostat.

In a further advantageous variant, the cryogen evaporating from one of the cryocontainers of the cryostat is heated in the suspension tube of the cryocontainer to approximately surrounding temperature, guided to the cold stage through a further line and/or the connecting line, in particular a pipe conduit in good thermal contact with the cold stage. At this cold stage and optionally at the coldest regenerator tube of the cold head of the pulse tube cooler, it is cooled to liquefying temperature and finally liquefied, wherein the liquefied cryogen is returned to the cryocontainer via the further line.

The heat transfer between at least one cold stage of the cold head and at least one of the cryocontainers and/or the radiation shield may advantageously be effected within a closed cooling circuit with a further refrigerant, wherein a gas with low boiling temperature is used as further refrigerant, the cooling circuit being driven via free convection, a circulating pump or the compressor of the cryocooler.

In a further advantageous variant of the inventive method, the heat transfer between at least one cold stage of the cold head and at least one of the cryocontainers and/or the radiation shield is effected within a partial circuit of the cooling circuit of the NMR probe head, wherein the circuit is driven via the compressor of the cryocooler or optionally via a circulating pump.

Part of the refrigerant is thereby advantageously precooled through intermediate expansion of another part of the refrigerant to cool the first cryocontainer, such that the refrigerant is liquefied due to expansion of the precooled part of the refrigerant to the same or a lower gas pressure as in the first cryocontainer. This may be achieved e.g. using one or more Joule-Thomson valves and one or more counter flow heat exchangers.

The preamplifier of the NMR probe head may also be cooled with liquid nitrogen and/or nitrogen vapor in a separate closed circuit, wherein the liquid nitrogen evaporates through contact with the preamplifier of the NMR probe head during passage through the circuit, and is reliquefied by the cold head of the cooling device, the circuit being driven through free convection or by a circulating pump.

With particular preference, a pulse tube cooler is used as the cryocooler, and the refrigerant provided for cooling the NMR probe head is brought into thermal contact with at least the coldest regenerator tube of the cold stages of the cold head of the pulse tube cooler, thereby cooling it to a temperature between the temperatures of the two coldest cold stages.

Further advantages of the invention can be extracted from the description and the drawing. The features mentioned above and below may be used individually or in arbitrary combination. The embodiments shown and described are not to be understood as exhaustive enumeration but have exemplary character for illustrating the invention.

DESCRIPTION OF THE PREFERRED EMBODIMENT

Figure 1:
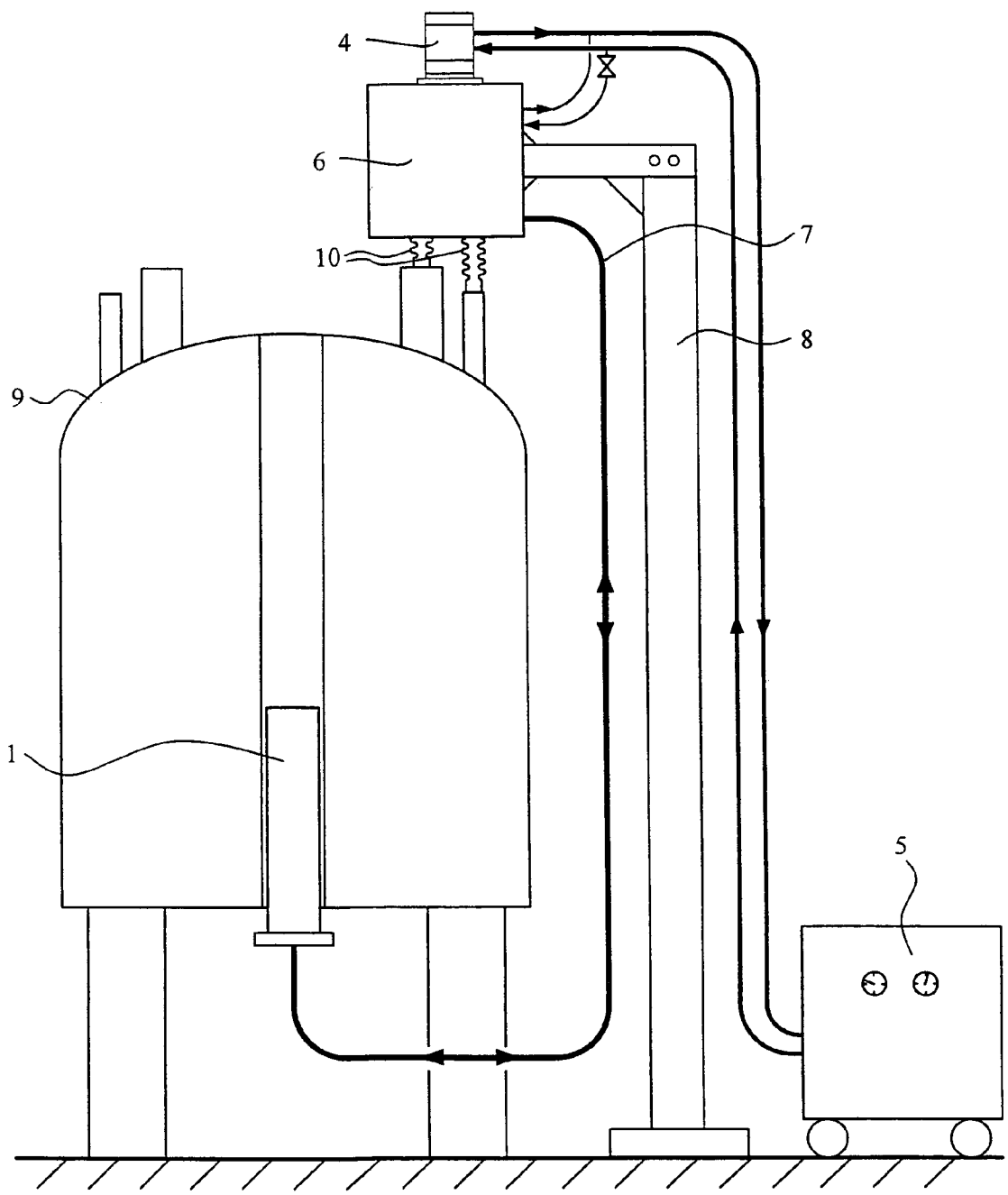
FIG. 1 shows a schematic view of an inventive NMR apparatus comprising a cryocooler for commonly cooling a cryostat and an NMR probe head.

The inventive NMR apparatus shown in FIG. 1 permits simultaneous cooling of an NMR probe head 1 and a cryostat 9 using one single cooling device which is more compact and less expensive than two separate cooling devices. A cold head 4 of a cryocooler, which is operated by a compressor 5, is accommodated in an external thermally insulated evacuated housing 6. The external arrangement of the cryocooler eliminates transfer of mechanical or magnetic disturbances of the cryocooler into the working volume of the NMR magnet system. This permits use of low-vibration pulse tube coolers and also Gifford-McMahon coolers, which cause greater disturbances. Since the cold head 4 of the cryocooler is externally arranged, its geometry is moreover not subjected to any limits. The housing 6 is connected to the NMR probe head 1 via one or more transfer lines 7. In the embodiment of FIG. 1, the housing 6 is mounted to the stand 8 and disposed directly above the cryostat 9 of the NMR apparatus. In order to prevent transfer of vibrations from the cold head 4 to the cryostat 9, bellows 10 are provided between the housing 6 and the cryostat 9. Simultaneous cooling of the cryostat 9 and the NMR probe head 1 using one single cold head 4 maximally utilizes the given refrigeration capacity of the cryocooler and realizes a compact cooling unit.

Figure 2:
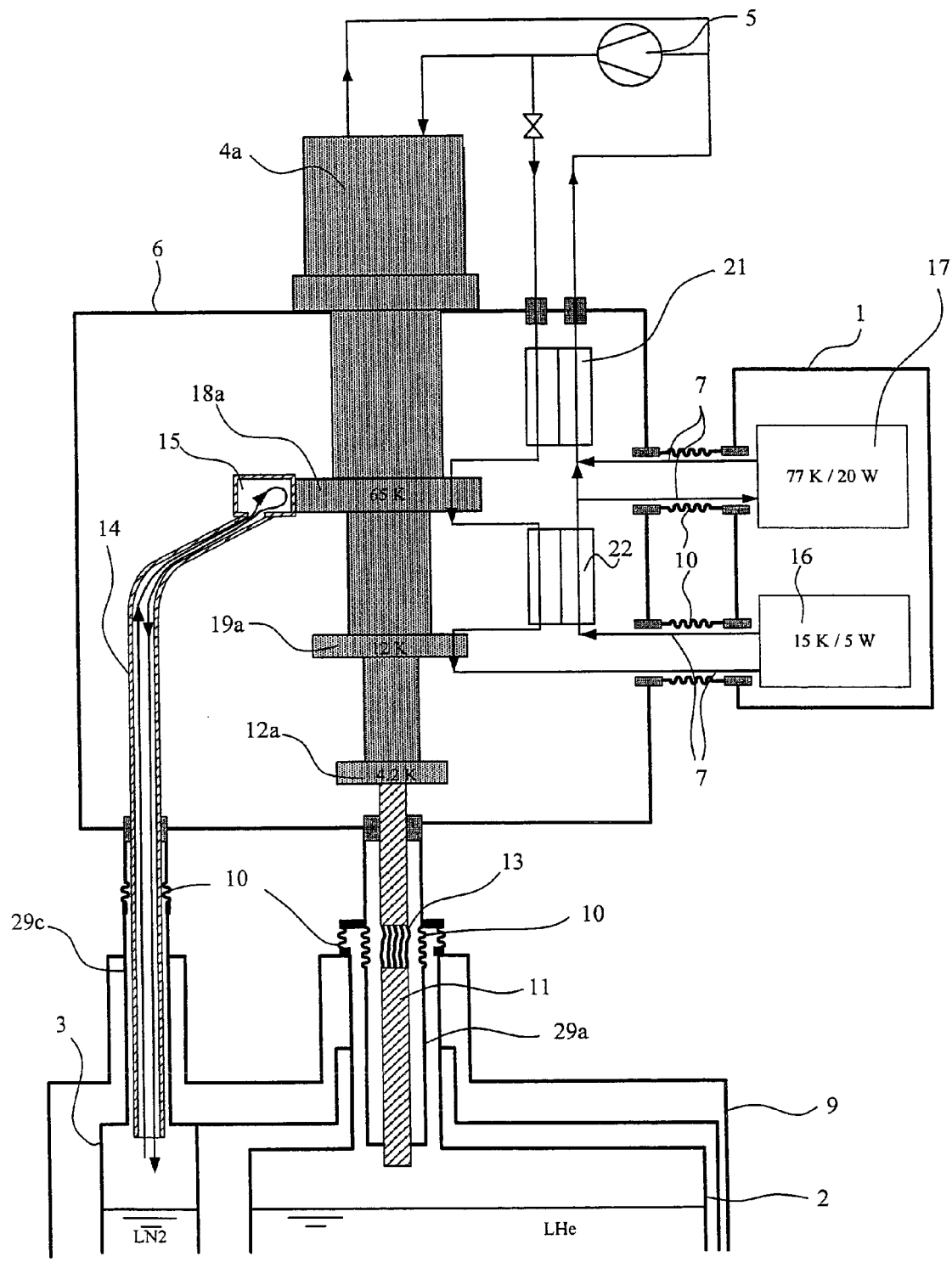
FIG. 2 shows a schematic section of an inventive NMR apparatus with a three-stage cryocooler and a heat-transferring metallic device for cooling a first cryocontainer and a pipe conduit connected to a cavity for cooling a further cryocontainer.

FIG. 2 shows a schematic section of an inventive NMR apparatus. A heat-transferring device in the form of a metallic connection 11 (e.g. of copper) having a high thermal conductivity is provided to cool a first cryocontainer 2, wherein one end of the connection 11 is connected to the coldest cold stage 12a of a three-stage cold head 4a, the other end projecting into the first cryocontainer 2. The connection 11 is guided into the first cryocontainer 2 via a suspension tube 29a thereof. The cryogenic vapor in the first cryocontainer 2 is liquefied at the end, projecting into the first cryocontainer 2, of the metallic connection 11 having a high thermal conductivity, as the cryogen gives off heat to the connection 11 and thereby to the cold head 4a. In order to eliminate transfer of vibrations from the cold head 4a to the first cryocontainer 2 via connection 11, the connection 11 having a high thermal conductivity is partially designed in the form of flexible strands 13, thereby effecting a soft connection. Helium, at a temperature of approximately 4.2 K, is preferably used as the cryogen in the first cryocontainer 2.

In the embodiment of FIG. 2, a further cryocontainer 3 is cooled using a line 14, in particular a pipe conduit which is connected to a cavity 15, wherein the cavity 15 is in contact with the first cold stage 18a of the cold head 4a. The line 14 is guided through a suspension tube 29c of the further cryocontainer 3 and terminates in the further cryocontainer 3. Evaporating cryogen, e.g. nitrogen, is guided from the further cryocontainer 3 through the line 14 into the cavity 15, where the cryogen is liquefied via heat exchange with the cold head 4a, and is subsequently returned to the further cryocontainer 3 through the line 14. The line 14 may also be designed as a concentric line which consists of two tubes: The cryogen vapor rises in the outer pipe gap to the cavity 15, and the liquefied cryogen returns to the further cryocontainer 3 via the inner tube. The line is advantageously also provided with vacuum insulation, at least in sections or along its entire length.

Moreover, the cold head 4a also cools an RF resonator 16 and a preamplifier 17 of the NMR probe head 1. The NMR probe head 1 is thereby not directly connected to the cold head 4a but is in contact therewith via a refrigerant that flows in a closed circuit. The transfer line 7 (consisting of four individual line strands) connects the NMR probe head 1 to the first cold stage 18a and the second cold stage 19a of the cold head 4a, wherein the first cold stage 18a of the cold head 4a is at approximately 65 K and the second cold stage 19a at approximately 12 K. Both cold stages 18a, 19a have thermal contact surfaces for giving off cold, which may be connected e.g. to heat exchangers to transfer heat from the refrigerant of the cooling circuit to the cold head 4a.

The refrigerant (e.g. helium) is circulated in the cooling circuit of the NMR probe head 1 using the cryocooler compressor 5. The refrigerant is initially precooled using a first counter flow heat exchanger 21 and subsequently at the first cold stage 18a of the cold head 4a to 65 K before reaching the second counter flow heat exchanger 22 and finally the second cold stage 19a, where the refrigerant is cooled to 12 K. The cooled refrigerant is supplied via the transfer line 7 to the RF resonator 16, which cools the latter to approximately 15 K. The refrigerant heated to 15 K subsequently reaches the housing 6 via the transfer line 7 and the second counter flow heat exchanger 22. After passage of the second counter flow heat exchanger 22, part of the refrigerant is supplied via the transfer line 7 to the preamplifier 17, thereby cooling it to approximately 77 K. The refrigerant heated to 77 K subsequently flows to the housing 6 via the transfer line 7, where it is mixed with the residual flow from the second counter flow heat exchanger 22 and is guided to the compressor 5 via the first counter flow heat exchanger 21.

The first cryocontainer 2, the additional cryocontainer 3 and the NMR probe head 1 are thereby cooled using one single cold head 4a via three separate cold transmitting mechanisms. The housing 6 with cold head 4a is connected to the cryostat 9 and the NMR probe head 1 in a gas-tight manner via the bellows 10 to eliminate, or at least substantially dampen, transfer of vibrations from the cold head 4a to the cryostat 9 and the NMR probe head 1.

Figure 3:
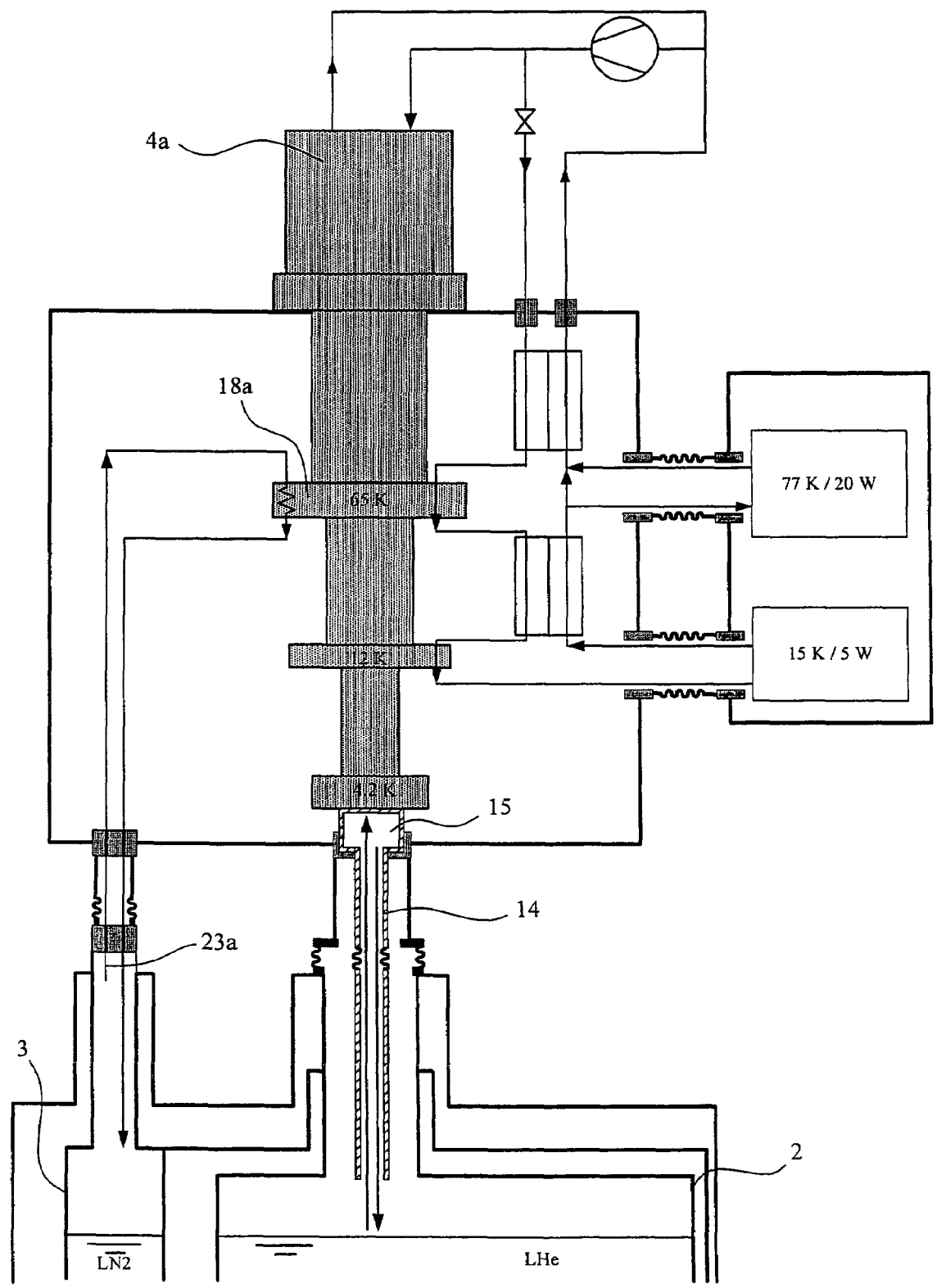
FIG. 3 shows a schematic section of an inventive NMR apparatus with a three-stage cryocooler and a pipe conduit connected to the cavity for cooling a first cryocontainer, and a further line for cooling a further cryocontainer.

FIG. 3 shows an embodiment of the invention, with which the first cryocontainer 2 is cooled via a line 14, which is connected to a cavity 15. A further line 23a is inserted into the further cryocontainer 3, which is guided to the first cold stage 18a of the cold head 4a and is in contact therewith. Evaporated cryogen, which is heated to approximately surrounding temperature, is guided to the first cold stage 18a of the cold head 4a via the further line 23a. Heat is transferred from the cryogen to the cold stage 18a at the first cold stage 18a to cool and liquefy the cryogen, returning it to the further cryocontainer 3.

Figure 4:
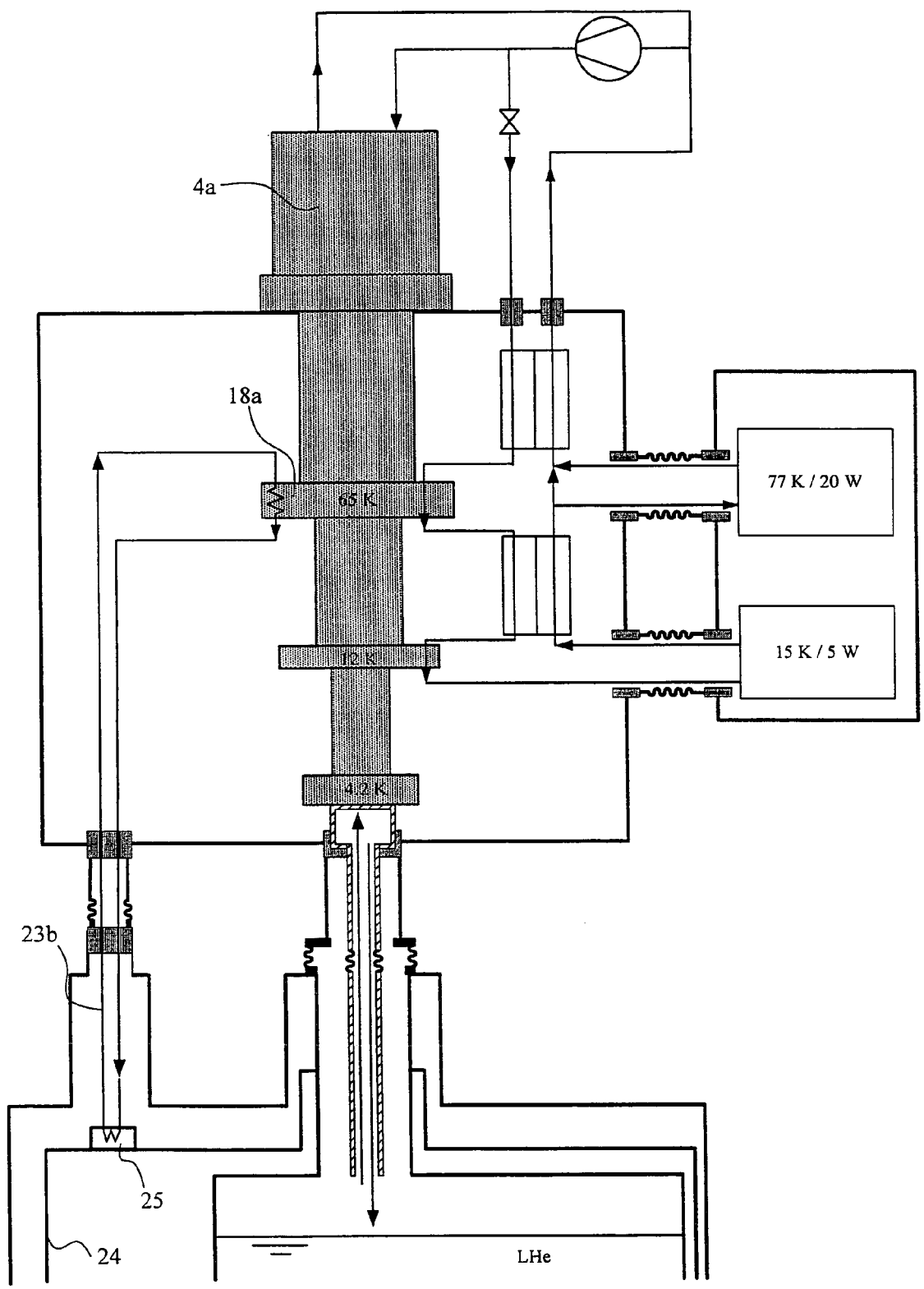
FIG. 4 shows a schematic section of an inventive NMR apparatus with a three-stage cryocooler and a pipe conduit, connected to the cavity, for cooling a first cryocontainer and a further line for cooling a radiation shield.

In the embodiment of the invention shown in FIG. 4, a radiation shield 24 is cooled instead of a further cryocontainer 3. A further line 23b forms a closed circuit in which a refrigerant is cooled at the first cold stage 18a of the cold head 4a and guided to a heat exchanger 25. The heat exchanger 25 is in contact with the radiation shield 24, thereby picking up heat from the radiation shield 24. The cooling circuit of the further line 23b is thereby driven through free convection. The use of a circulating pump is also feasible.

Figure 5:
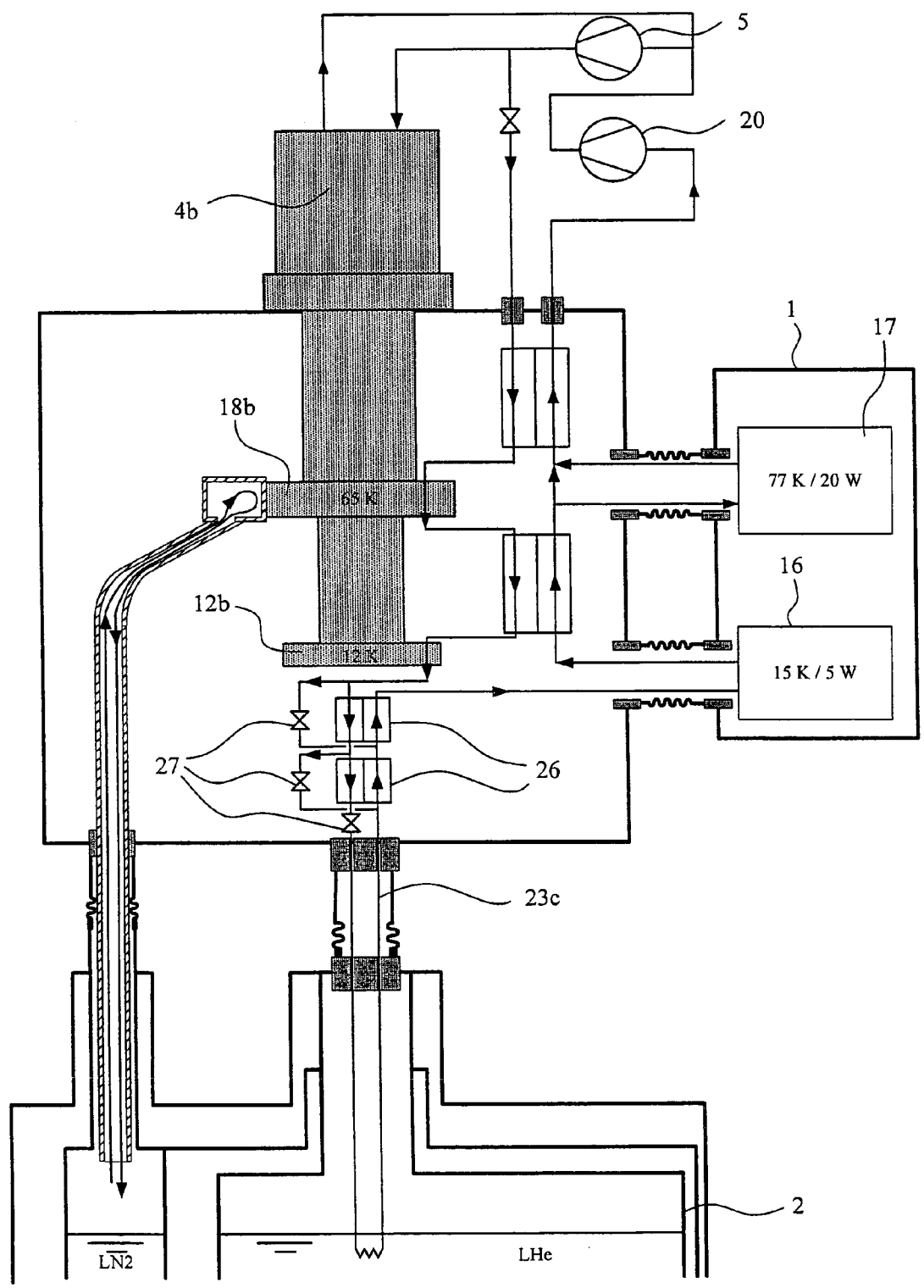
FIG. 5 shows a schematic section of an inventive NMR apparatus with a two-stage cryocooler and a common cooling circuit for cooling a first cryocontainer and an NMR probe head, and a pipe conduit, connected to a cavity, for cooling a further cryocontainer.

In the NMR apparatus of FIG. 5, cooling of the first cryocontainer 2 is directly combined with cooling of the NMR probe head 1 and is realized in one single cooling circuit. In contrast to the examples of FIGS. 2 through 4, a two-stage cold head 4b with cold stages 18b, 12b is thereby provided for cooling, wherein the coldest cold stage 12b has a temperature of approximately 12 K. The refrigerant (helium) of the closed circuit is cooled at the cold stages 18b, 12b of the cold head 4b and supplied to the components to be cooled (first cryocontainer, 2, RF resonator 16, preamplifier 17). In addition to the cooling circuit of the NMR probe head 1 described in FIG. 2, in the NMR apparatus of FIG. 5, the refrigerant of the cooling circuit is guided, after cooling, from the coldest cold stage 12b of the cold head 4b in two counter flow heat exchangers 26 into the first cryocontainer 2, in which a further line 23c comes in contact with the cryogen in the first cryocontainer 2. After cooling of the refrigerant at the cold stage 12b to approximately 12 K, the refrigerant flow is divided so that part thereof passes through further counter flow heat exchangers 26 and another part is cooled in devices 27 for intermediate expansion, e.g. Joule Thomson valves. Cooling with isenthalpic pressure reduction is effected when the refrigerant has a positive integral Joule-Thomson coefficient in the predetermined initial and final states. The cooled partial flows precool the partial flow in the counter flow heat exchangers 26 supplied to the first cryocontainer 2. Final expansion to a pressure slightly below the pressure in the first cryocontainer finally partially liquefies the precooled partial flow. The refrigerant picks up heat from the first cryocontainer 2 and subsequently returns in the form of saturated vapor or slightly overheated vapor through the further counter flow heat exchanger 26, is thereby heated and guided into the NMR probe head 1 to cool the RF resonator 16 and preamplifier 17. Since the refrigerant in the Joule-Thomson valves must be expanded to a low pressure, generally to or slightly below ambient pressure, a further (smaller) compressor 20 is required to re-compress the refrigerant to the low-pressure level of the refrigeration compressor 5. The cooling circuit may also be completely separated from the refrigeration compressor 5, using an additional separate compressor that compresses the refrigerant from ambient pressure to a high pressure required for process control.

Combination of cooling of the first cryocontainer 2 and cooling of the NMR probe head 1 is disadvantageous in that individual cooling of both partial systems is difficult. Interruption of probe head cooling and continuing cooling of the cryocontainer 2 would require further fittings and lines in the cooling circuit, which increases equipment expense.

Figure 6:
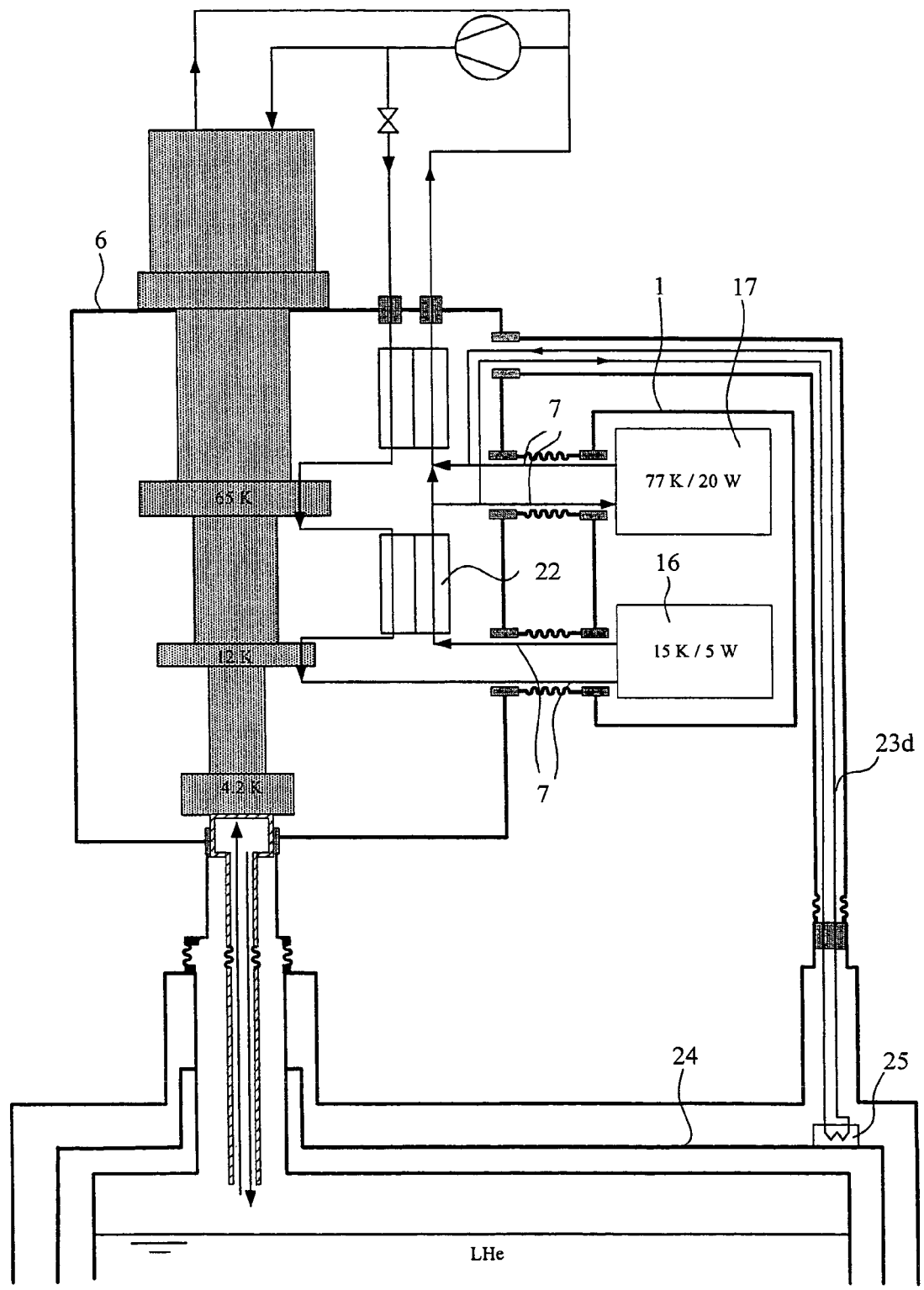
FIG. 6 shows a schematic section of an inventive NMR apparatus with a three-stage cryocooler and a pipe conduit, connected to a cavity, for cooling a first cryocontainer, and a common cooling circuit for cooling a radiation shield and an NMR probe head.

In the device of FIG. 6, the cooling circuits of the NMR probe head 1 and the radiation shield 24 are coupled to form a closed cooling circuit. The preamplifier 17 as well as the radiation shield 24 must be cooled to approximately 77K and for this reason, part of the refrigerant used for probe head cooling is branched off from the main flow after passage through the RF resonator 16 and the second counter flow heat exchanger 22, and guided in the further line 23d to the radiation shield 24, while the other part of the refrigerant passes through the preamplifier 17. The refrigerant supplied to the radiation shield 24 picks up heat input into the radiation shield 24 via the heat exchanger 25, and is joined with the return line from the preamplifier 17 within the housing 6. Independent cooling of the radiation shield 24 and NMR probe head 1 is no longer possible in the embodiment of FIG. 6.

Figure 7:
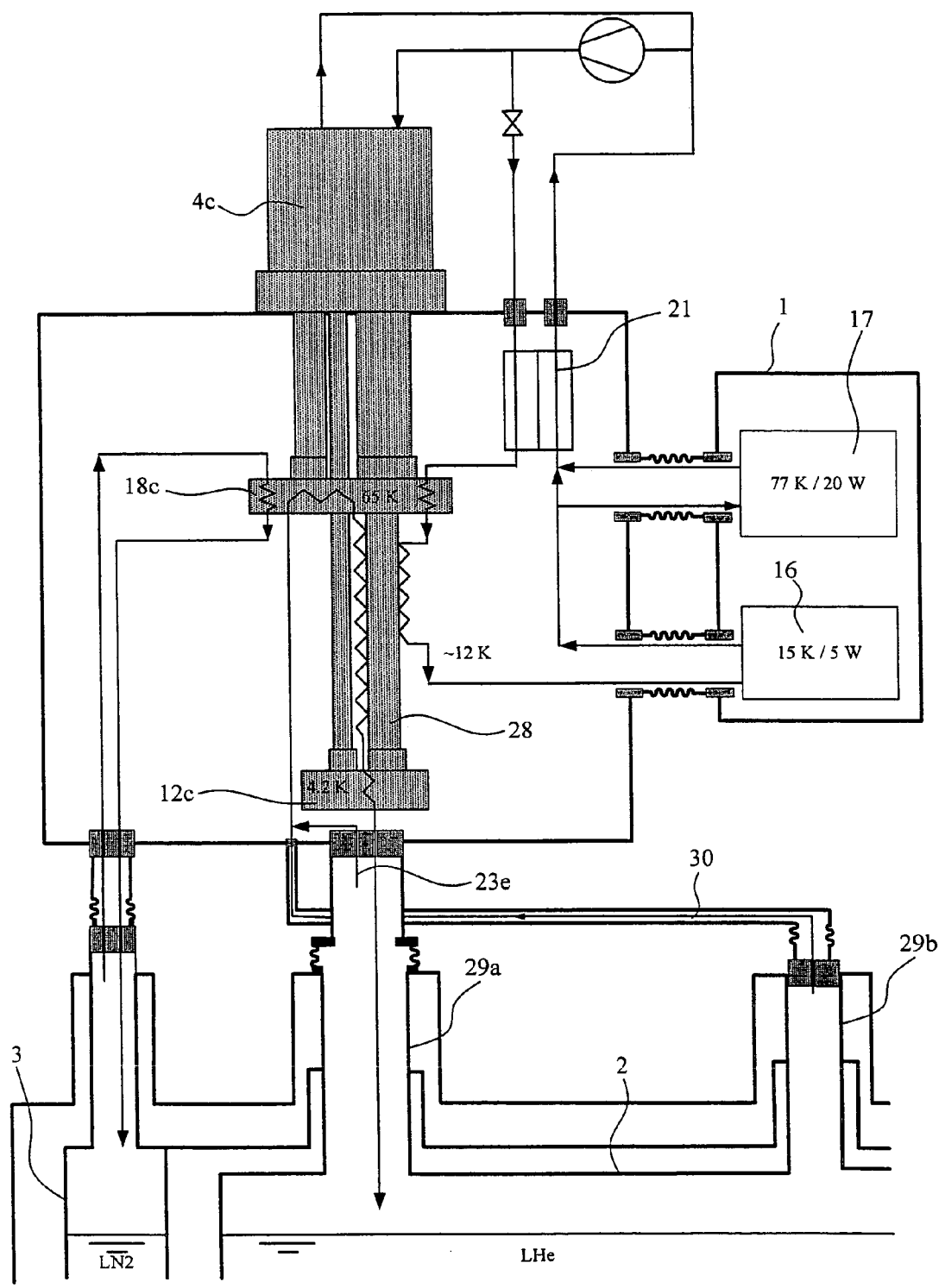
FIG. 7 shows a schematic section of an inventive NMR apparatus with a two-stage pulse tube cooler with variable temperature tapping for a cooling circuit of an NMR probe head and with a line combined from two lines for cooling a first cryocontainer, and with a further line for cooling a further cryocontainer.

The use of a cold head 4c of a pulse tube cooler comprising two cold stages 18c, 12c is particularly advantageous. The refrigerant of the circuit for cooling the probe head 1 and the cryogen evaporated and heated in the first cryocontainer 2 may then be brought into thermal contact with the regenerator tube 28 of the coldest cold stage 12c of the pulse tube cooler (FIG. 7). The cryogen evaporated through heat input and heated in the suspension tubes 29a and 29b is guided through lines 23e, 30 into the housing 6, where it is mixed and guided to the first cold stage 18c of the cold head 4c, where it is cooled to approximately 65 K. The cryogen is subsequently further cooled along the regenerator tube 28 and finally liquefied in contact with the coldest cold stage 12c of the cold head 4c and returned into the first cryocontainer 2, thereby cooling the suspension tubes 29a and 29b and reducing the heat input into the first cryocontainer 2.

Since the RF resonator 16 need only be cooled to approximately 15 K, the refrigerant used for cooling the RF resonator 16 need not be cooled to the temperature of the coldest cold stage 12c (4.2 K). For this reason, the refrigerant of the cooling circuit of the NMR probe head 1 of the embodiment of FIG. 7 is precooled in the counter flow heat exchanger 21 with the refrigerant discharged from the NMR probe head 1, subsequently precooled at the first cold stage 18c of the cold head 4c, and finally cooled along a section of the regenerator tube 28 of the coldest cold stage 12c to the required temperature. The refrigerant of the cooling circuit of the NMR probe head 1 is thereby not guided to the cold end of the coldest cold stage 12c of the cold head 4c but merely to one location of the regenerator tube 28 where the refrigerant has a temperature which is suited for cooling the RF resonator 16 and the preamplifier 17 of the NMR probe head 1. The length of the contact surface between the refrigerant and the regenerator tube 28 can be freely selected which permits optimization of the cooling temperature of the refrigerant in a temperature range between the temperature of the coldest cold stage 12c (4.2 K) and the first cold stage 18c (e.g. 65 K) as desired. The additional heat input into the regenerator tube 28 of the coldest cold stage 12c impairs the refrigeration capacity of the coldest cold stage 12c of the pulse tube cooler. With suitable process control and design, however, the thermodynamic efficiency of the overall system can thereby even be increased. The number of counter flow heat exchangers may also be reduced.

Figure 8:
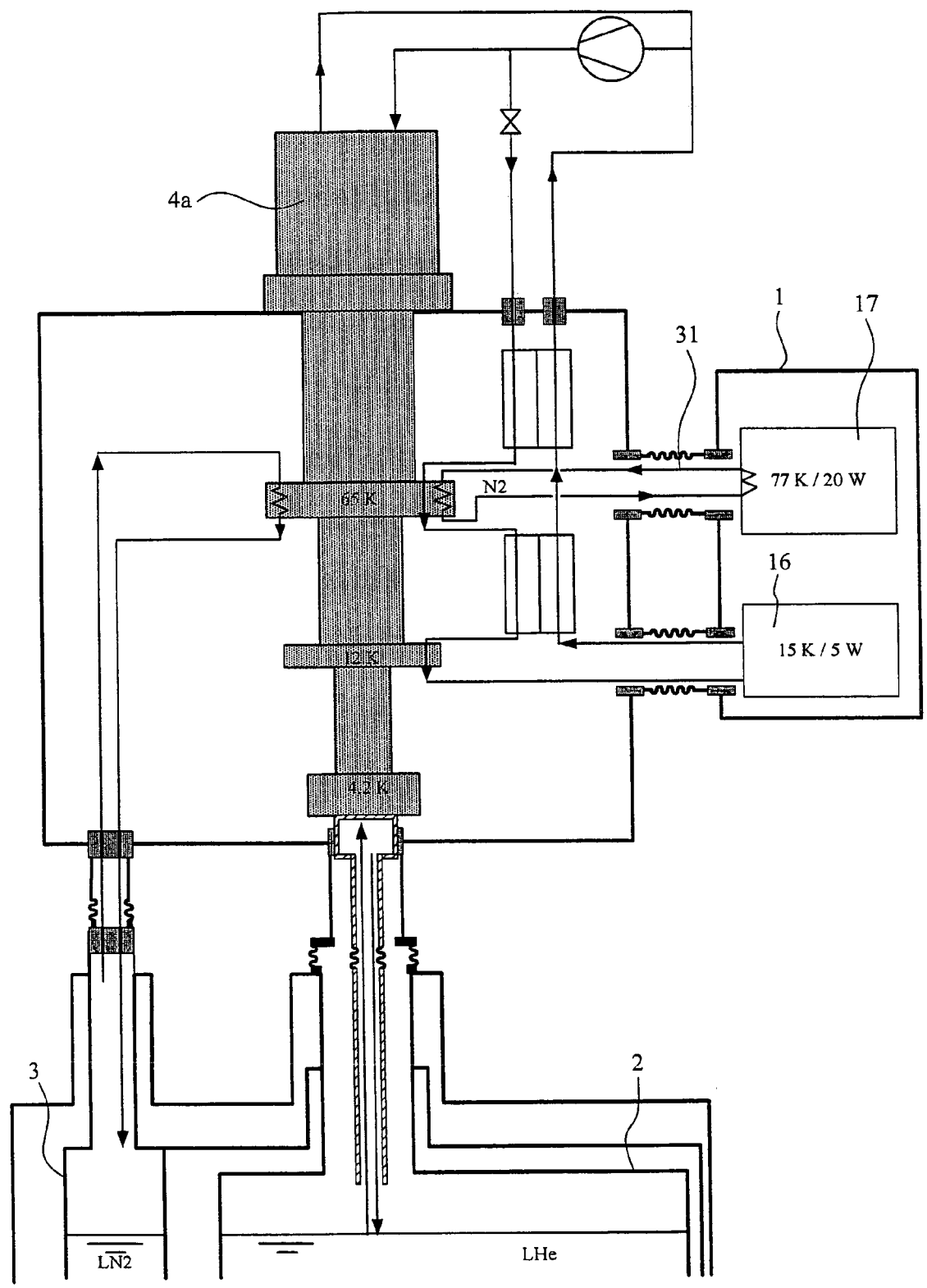
FIG. 8 shows a schematic section of an inventive NMR apparatus with a three-stage cryocooler and a separate cooling circuit for a preamplifier of an NMR probe head.

Helium, beyond the critical point, is preferably used as refrigerant for the closed cooling circuits. A separate closed cooling circuit 31 may, however, also be provided for cooling the preamplifier 17 of the NMR probe head 1 (FIG. 8). This cooling circuit 31 may be operated with a refrigerant, which boils at higher temperatures (e.g. nitrogen), since the preamplifier 17 must be cooled only to approximately 77 K. In the embodiment of FIG. 8, the inventive NMR apparatus cools the cryocontainers 2, 3, the preamplifier 17 and the RF resonator 16 using one single cold head 4a and four separate cold coupling mechanisms. This permits e.g. heating of the NMR probe head 1 without switching off the cryocooler (and thereby cooling of the magnet).

In total, one obtains an NMR apparatus with efficient cooling and improved vibration decoupling, at the same time minimizing cryogen loss. The inventive device also reduces the influence on the magnetic field of the magnet system by the magnetic regenerator materials of the cold head (and vice versa). In addition thereto, NMR measurements can be continued even when cooling of the cryostat has been interrupted, since the cryogenic liquids at least temporarily ensure cooling of the magnet.

LIST OF REFERENCE NUMERALS

1 NMR probe head
2 first cryocontainer
3 additional cryocontainer
4 cold head
4a three-stage cold head
4b two-stage cold head
4c two-stage cold head of a pulse tube cooler
5 refrigeration compressor
6 evacuated housing
7 transfer line
8 stand
9 cryostat
10 bellows
11 connection with a high thermal conductivity
12a coldest cold stage of the three-stage cold head
12b coldest cold stage of the two-stage cold head
12c coldest cold stage of the two-stage cold head of the pulse tube cooler
13 strands
14 line
15 cavity
16 RF resonator
17 preamplifier
18a first cold stage of the three-stage cold head
18b first cold stage of the two-stage cold head
18c first cold stage of the two-stage cold head of the pulse tube cooler
19a second cold stage of the three-stage cold head
20 further compressor
21 first counter flow heat exchanger
23a further line of the cooling circuit of the additional cryocontainer
23b further line of the cooling circuit of the radiation shield
23c further line of the cooling circuit of the pulse tube cooler
23d further line of the cooling circuit of the radiation shield
23e further line of the cooling circuit of the first cryocontainer
24 radiation shield
25 heat exchanger
26 further counter flow heat exchanger
27 device for intermediate expansion
28 regenerator tube of the coldest cold stage
29a suspension tube of the first cryocontainer
29b further suspension tube of the first cryocontainer
29c suspension tube of the further cryocontainer
30 connecting line
31 cooling circuit for preamplifier

We claim:
1. An NMR apparatus for investigation of a sample, the apparatus comprising:
a cryostat defining a room temperature bore and having a first cryocontainer installed within an evacuated outer jacket, said cryostat also having at least one radiation shield and/or a further cryocontainer and at least one suspension tube;
an NMR probe head disposed in said room temperature bore, said probe head having an RF resonator for receiving NMR signals from the sample as well as a preamplifier for amplifying said NMR signals;
an NMR magnet system disposed in said first cryocontainer;

a cooling device for cooling said probe head, said first cryocontainer, said radiation shield, and/or said further cryocontainer, said cooling device having a compressor-operated cold head of a cryocooler with several cold stages at differing temperatures;

a separate, evacuated and thermally insulated housing in which said cooling device is disposed, said housing positioned directly above said cryostat;

at least one cooling circuit having a refrigerant and communicating between said cooling device and said NMR probe head, said cooling circuit driven by said cooling device compressor or via a pump;

an at least partially thermally insulated transfer line for passing said refrigerant; and at least one heat-transferring device connected to at least one cold stage of said cold head in a thermally conducting fashion, said heat-transferring device being directly inserted and proximate to one said suspension tube and/or contacts said radiation shield.

2. The NMR apparatus of claim 1, wherein said housing of said cooling device is mounted to said cryostat of said NMR magnet system.

3. The NMR apparatus of claim 1, wherein said housing of said cooling device is externally mounted, is mounted to a ceiling of a room, or is mounted to a stand.

4. The NMR apparatus of claim 1, wherein said cooling device is connected to said cryostat and said probe head in a gas-tight manner via components, which eliminate or greatly reduce transmission of vibrations.

5. The NMR apparatus of claim 1, wherein at least one said heat-transferring device has a metallic connection of a high thermal conductivity, with an end thereof which projects into said suspension tube and at which a cryogen evaporating from a cryocontainer of said cryostat is liquefied.

6. The NMR apparatus of claim 1, wherein said cryocooler is a pulse tube cooler or a Gifford-McMahon cooler with at least two cold stages.

7. The NMR apparatus of claim 6, wherein said heat-transferring device comprises a further line or a pipe conduit which is open at both ends and which is in good thermal contact with a cold stage of a pulse tube cooler which is warmer than a coldest cold stage and with at least a coldest regenerator tube of said cold stage, wherein said further line or pipe conduit is connected, at one of said open ends, to a warm end of said suspension tube, the other open end extending into said first cryocontainer such that said cryogen is cooled to a liquefying temperature and is liquefied, said further line or pipe conduit thereby guiding cryogen evaporated from said first cryocontainer of said cryostat and heated in said suspension tube to approximately a surrounding temperature to said cold stage of said pulse tube cooler and returning said cryogen to said first cryocontainer.

8. The NMR apparatus of claim 6, wherein at least part of said refrigerant is in thermal contact with at least a coldest regenerator tube of cold stages of a pulse tube cooler in said cooling circuit for cooling said NMR probe head, such that said refrigerant is cooled to a temperature in a range between temperatures of two coldest cold stages.

9. The NMR apparatus of claim 1, wherein at least one of said heat-transferring device comprises a pipe conduit or a line which is open at both ends for guiding a cryogen evaporated from one of said cryocontainers to said cold stage and for returning said cryogen, liquefied at said cold stage, into said cryocontainer of said cryostat, and also having a cavity, wherein one open end of said line terminates in said cavity and an other open end of said line terminates in said cryocontainer.

10. The NMR apparatus for claim 1, wherein at least one of said heat-transferring device comprises a further line or a pipe conduit which is open at both ends and which is in good thermal contact with a cold stage which is not a coldest cold stage, with one open end thereof being connected to a warm end of said suspension tube and an other open end thereof extending into said further cryocontainer, wherein said further line or pipe conduit guides cryogen, evaporated from said further cryocontainer and heated in said suspension tube to approximately a surrounding temperature, to said cold stage and returns liquefied cryogen, cooled at said cold stage to a liquefying temperature, into said further cryocontainer.

11. The NMR apparatus of claim 1, wherein at least one of said heat-transferring device is designed as a closed additional cooling circuit with a further refrigerant and communicating between at least one cold stage of said cold head and at least one of said cryocontainers and/or said radiation shield, wherein a gas with low boiling temperature is provided as a further refrigerant, said further cooling circuit being driven through free convection, by a circulating pump, or by said compressor of said cryocooler.

12. The NMR apparatus of claim 1, wherein one of said heat-transferring devices which is inserted into said first cryocontainer is designed as a partial circuit of said cooling circuit of said NMR probe head, wherein a gas with low boiling temperature is provided as refrigerant, and further comprising a device for intermediate expansion of part of refrigerant to precool another part of said refrigerant, wherein said cooling circuit is driven via said compressor of said cryocooler and/or by a further compressor.

13. The NMR apparatus of claim 1, wherein at least one said heat-transferring device is inserted into said further cryocontainer or is in contact with said radiation shield and is designed as a partial circuit of said cooling circuit of said NMR probe head, wherein said circuit is driven via said compressor of said cryocooler or via a circulating pump.

14. The NMR apparatus of claim 1, wherein at least one of said heat-transferring devices is insulated against external heat input or comprises vacuum insulation.

15. The NMR apparatus of claim 1, wherein said heat-transferring device is flexible, is flexible in sections, is designed as a bellows, and/or is in a form of braided wires.

16. The NMR apparatus of claim 1, wherein liquid helium of a temperature of 4.2 K or less can be generated at a coldest cold stage of said cold head.

17. The NMR apparatus of claim 1, wherein liquid nitrogen of a temperature of 77 K or less can be generated at a cold stage of said cold head of said cryocooler.

18. The NMR apparatus of claim 1, further comprising a connecting line communicating between at least one of said suspension tubes of said first cryocontainer, which does not have an inserted said heat-transferring device, and said first cryocontainer, wherein said connecting line is in contact with at least one cold stage of said cold head of said cryocooler of said cooling device, said connecting line structured for insertion of a valve and /or a pump.

19. The NMR apparatus of claim 1, further comprising a separate closed cooling circuit with liquid nitrogen and/or nitrogen vapor for cooling said preamplifier of said NMR probe head, within which liquid nitrogen of said cooling cycle evaporates and is reliquefied by a cold head of said cooling device, wherein said cooling circuit is driven via free convection or by a circulating pump and is insulated from external heat input or is vacuum insulated.

20. The NMR apparatus of claim 1, further comprising an electric heating means disposed in at least one cryocontainer.

21. The NMR apparatus of claim 1, further comprising an electric heating means which is disposed at cold stages of said cooling device, on other components of said cooling device, on said heat-transferring device, or on said transfer line.

22. The NMR apparatus of claim 1, wherein helium is used as refrigerant of said cooling circuit between said cold head of said cryocooler and said NMR probe head and/or as further refrigerant of a further cooling circuit between said cold head of said cryocooler and at least one of said cryocontainers.

23. A method for operating the NMR apparatus of claim 1, wherein said NMR probe head and at least one cryocontainer of the NMR apparatus are cooled using a common cryocooler, wherein a temperature and a refrigeration capacity required for cooling said NMR probe head and said cryocontainer are generated outside of said cryostat, wherein at least one said heat-transferring device is in contact with said cold head of said cryocooler and is inserted directly and proximately into said suspension tube of said first cryocontainer, of said further cryocontainer, and/or is in contact with said radiation shield, wherein gaseous cryogen in said cryocontainer is liquefied using said heat-transferring device, and wherein a refrigerant is transferred from said cooling device to said NMR probe head via at least one said transfer line, said transfer line being at least partially thermally insulated and disposed outside of said cryostat.

24. The method of claim 23, wherein said gaseous cryogen in said cryocontainer is liquefied at an end of a metallic connection having high thermal conductivity, which projects into at least one of said cryocontainers.

25. The method of claim 23, wherein cryogen evaporated from one of said cryocontainers of said cryostat is guided through a line or through a pipe conduit, into a cavity at a cold stage of said cryocooler, is liquefied at said cold stage and is subsequently returned via said pipe conduit into said cryocontainer.

26. The method of claim 23, wherein cryogen evaporated from one of said cryocontainers of said cryostat is heated in said suspension tube of said cryocontainer to approximately a surrounding temperature and is guided to said cold stage through a further line, a connecting line, or a pipe conduit with good thermal contact to said cold stage and is cooled there or is cooled at least at a coldest regenerator tube of said cold head of a pulse tube cooler, and finally liquefied, said liquefied cryogen being returned to said cryocontainer via said further line.

27. The method of claim 23, wherein heat transfer between at least one cold stage of said cold head and at least one of said cryocontainers and/or said radiation shield is effected within a closed cooling circuit using an additional refrigerant, wherein a gas with low boiling temperature is used as said additional refrigerant, the circuit being driven through free convection, by a circulating pump, or via said compressor of said cryocooler.

28. The method of claim 27, wherein part of said refrigerant is precooled through intermediate expansion of another part of said refrigerant for cooling said first cryocontainer, such that said refrigerant is liquefied through expansion of said precooled part of said refrigerant to a same or a lower gas pressure as in said first cryocontainer.

29. The method of claim 23, wherein heat transfer between at least one cold stage of said cold head and at least one of said cryocontainers and/or said radiation shield is effected within a partial circuit of said cooling circuit of said NMR probe head, said circuit being driven via said compressor of said cryocooler or via a circulating pump.

30. The method of claim 23, wherein said preamplifier of said NMR probe head is cooled with liquid nitrogen and/or nitrogen vapor in a separate closed circuit, wherein said liquid nitrogen evaporates through contact with said preamplifier of said NMR probe head during passage through said circuit and is reliquefied by said cold head of said cooling device, said circuit being driven through free convection or via a circulating pump.

31. The method of claim 23, wherein said cryocooler is a pulse tube cooler and said refrigerant for cooling said NMR probe head is brought into thermal contact with at least a coldest regenerator tube of cold stages of said cold head of said pulse tube cooler and is thereby cooled to a temperature in a range between the temperatures of two coldest cold stages.

* * * * *